United States Patent
Morikawa

(10) Patent No.: US 7,477,566 B2
(45) Date of Patent: Jan. 13, 2009

(54) MULTI-PORT SEMICONDUCTOR MEMORY

(75) Inventor: Koichi Morikawa, Tokyo (JP)

(73) Assignee: OKI Semiconductor Co., Ltd. (JP)

( * ) Notice: Subject to any disclaimer, the term of this patent is extended or adjusted under 35 U.S.C. 154(b) by 0 days.

(21) Appl. No.: 11/604,352

(22) Filed: Nov. 27, 2006

(65) Prior Publication Data

US 2007/0070779 A1   Mar. 29, 2007

Related U.S. Application Data

(62) Division of application No. 10/779,780, filed on Feb. 18, 2004, now Pat. No. 7,170,814.

(30) Foreign Application Priority Data

Sep. 16, 2003   (JP) .............................. 2003-322802

(51) Int. Cl.
  *G11C 8/00* (2006.01)
  *G11C 11/00* (2006.01)
  *G11C 7/00* (2006.01)
(52) U.S. Cl. .................. 365/230.05; 365/154; 365/156; 365/189.11
(58) Field of Classification Search ................ 365/154, 365/156, 230.05, 189.11, 155; 711/149
See application file for complete search history.

(56) References Cited

U.S. PATENT DOCUMENTS

| | | | |
|---|---|---|---|
| 4,541,076 A | 9/1985 | Bowers et al. | |
| 4,764,899 A | 8/1988 | Lewallen et al. | |
| 5,583,816 A * | 12/1996 | McClure | 365/201 |
| 5,629,943 A * | 5/1997 | McClure | 714/718 |
| 5,699,316 A | 12/1997 | Matsui et al. | |
| 5,715,191 A * | 2/1998 | Yamauchi et al. | 365/156 |
| 5,781,469 A * | 7/1998 | Pathak et al. | 365/156 |
| 5,793,681 A | 8/1998 | Nii | |
| 5,815,432 A * | 9/1998 | Naffziger et al. | 365/154 |
| 5,907,510 A * | 5/1999 | Sheffield et al. | 365/189.09 |
| 5,946,264 A * | 8/1999 | McClure | 365/230.06 |
| 6,078,513 A * | 6/2000 | Ong et al. | 365/49 |
| 6,222,777 B1 | 4/2001 | Khieu | |
| 6,307,793 B1 | 10/2001 | Murakami | |

(Continued)

FOREIGN PATENT DOCUMENTS

JP   07-230692   8/1995

(Continued)

*Primary Examiner*—Ly D Pham
(74) *Attorney, Agent, or Firm*—Studebaker & Brackett PC; Donald R. Studebaker

(57) ABSTRACT

A multi-port semiconductor memory in which wrong read-out due to coupling noise is hardly generated and operation speed is fast is provided. When data are written in memory cells from a pair of bit lines for one port, NMOS transistors become on. Electrical potential only at a low-level side is pulled up between the pair of bit lines, because electrical potential at a high-level side is approximately equivalent to power potential. Accordingly, when one of adjacent bit lines is on high-level and the other is on low-level, potential difference is reduced by the pull-up, resulting in reduction of generating time of the coupling noise. Although read-out of data can not be performed while the coupling noise is being generated, since the concerned generating time is reduced in the invention, the operation speed is substantially fast.

4 Claims, 4 Drawing Sheets

U.S. PATENT DOCUMENTS

| | | | |
|---|---|---|---|
| 6,549,453 B2 * | 4/2003 | Wong | 365/156 |
| 6,618,316 B2 | 9/2003 | Hsu et al. | |
| 6,639,866 B2 | 10/2003 | Slamowitz et al. | |
| 6,751,151 B2 * | 6/2004 | Hsu et al. | 365/230.05 |
| 6,795,330 B2 * | 9/2004 | Demange et al. | 365/145 |
| 6,880,144 B2 | 4/2005 | Kumala | |
| 6,954,370 B2 | 10/2005 | Kang | |
| 2004/0130933 A1 * | 7/2004 | Kanehara et al. | 365/154 |

FOREIGN PATENT DOCUMENTS

| | | |
|---|---|---|
| JP | 09-007373 | 1/1997 |
| JP | 11-261017 | 9/1999 |

\* cited by examiner

STRUCTURE OF THE FIRST EMBODIMENT

OPERATION OF THE FIRST EMBODIMENT

STRUCTURE OF MULTI-PORT SEMICONDUCTOR
MEMORY FOR COMPARISON

PRIOR ART

STRUCTURE OF THE SECOND EMBODIMENT

MULTI-PORT SEMICONDUCTOR MEMORY

This application is Divisional of U.S. application Ser. No. 10/779,780 filed Feb. 18, 2004 now U.S. Pat. No. 7,170,814.

BACKGROUND OF THE INVENTION

1. Field of the Invention

The present invention relates to a multi-port semiconductor memory, or a semiconductor memory having multiple input and output ports.

2. Description of the Related Art

The multi-port semiconductor memory has been used for, for example, a register file for microprocessor or image memory for graphics. Each of the multiple ports of the multi-port semiconductor memory can perform write-in or read-out of data independently. That is, input and output of data through respective input and output ports are performed concurrently. Therefore, since waiting time for the input and output of data is reduced, processing capacity of the processor is improved as a whole. For example, in a microprocessor using a two-port semiconductor memory, two data can be loaded in one cycle.

As the literatures regarding the multi-port semiconductor memory, for example, JP-A-07-230692, JP-A-09-7373, and JP-A-11-261017 are known, of which the contents are incorporated herein by reference.

Typically, in the two-port semiconductor memory, one memory cell is connected to two sets of bit line pairs. For example, in the two-port semiconductor memory described in FIG. 3 in the above JP-A-09-7373, one memory cell 11 is connected to a bit line pair WBL, WBL/ and a bit line pair RBL, RBL/.

In such configured memory, coupling capacitance is produced between adjacent bit lines. For example, in the two-port semiconductor memory described in FIG. 3 in JP-A-9-7373, the coupling capacitance is produced between the bit lines WBL and RBL, in addition, the coupling capacitance is produced between the bit lines WBL/ and RBL/. The coupling capacitance is a cause of coupling noise. For example, if electrical potential of the bit line RBL is changed from high-level to low-level while the bit line WBL is being on high level, electrical potential of the bit line WBL is temporarily dropped. If the electrical potential of the bit line WBL is read out while the coupling noise is being generated, the read-out data value may be wrong.

The coupling noise disappears after a certain period of time has passed since the noise was generated. Therefore, if it is determined that the electrical potential of one of the bit line pairs must not be read out before the predetermined time has passed since the electrical potential of the other of the bit line pairs was changed, the wrong read-out can be prevented. That is, influence of the coupling noise can be eliminated by staggering the read-out timing from the write-in timing.

Here, when the coupling capacitance is small, since generating time of the coupling noise is short, the wrong read-out can be prevented only by staggering the read-out from the write-in for a short time. On the other hand, when the coupling capacitance is large, the generating time of the coupling noise is long, therefore the read-out time of the two-port semiconductor memory is substantially lengthened. Today, distance among the bit lines is apt to be shortened with progress of fining of an integrated circuit, furthermore, bit line length is apt to be elongated according to increase of memory capacity. Each of them is a factor for increasing the coupling capacitance, or factor for lengthening the generating time of the coupling noise. Therefore, the read-out time becomes substantially longer as the fining of memory and increase of the memory capacity are progressed.

The subject of the invention is to provide a multi-port semiconductor memory in which the wrong read-out due to the coupling noise is hardly generated and operation speed is substantially fast.

SUMMARY OF THE INVENTION

The multi-port semiconductor memory according to the invention has a memory cell array including a plurality of memory cells; a first bit line pair that performs write-in and read-out of complementary data for each of the memory cells in the memory cell array; a second bit line pair that performs write-in and read-out of the complementary data for each of the memory cells in the memory cell array; a plurality of first word lines provided for each of the memory cells for selecting a memory cell that is accessed to the first bit line pair from the memory cell array; a plurality of second word lines provided for each of the memory cells for selecting a memory cell that is accessed to the second bit line pair from the memory cell array; and a first pull-up circuit that, when data is written in the selected memory cell from the first bit line pair, pulls up a low-level side of the concerned first bit line pair.

The multi-port semiconductor memory of the invention can pull up the low-level of the data written in the memory cell. Accordingly, since potential difference between a low-level bit line and a high-level bit line becomes small, the coupling noise is suppressed. In this way, according to the invention, the multi-port semiconductor memory in which the wrong read-out is hardly generated and operation speed is substantially fast can be provided.

It will be appreciated that the above general description and the following detailed description are merely typical examples of the invention and aim to provide outline or frame for understanding the claimed property and characteristics of the invention. The appended drawings are included for giving further understanding of the invention, and incorporated herein to constitute part of the specification. The drawings exemplify various embodiments of the invention and help for illustrating the principle and operation of the invention together with the detailed description.

DESCRIPTION OF THE PREFERRED EMBODIMENTS

Figure 1:
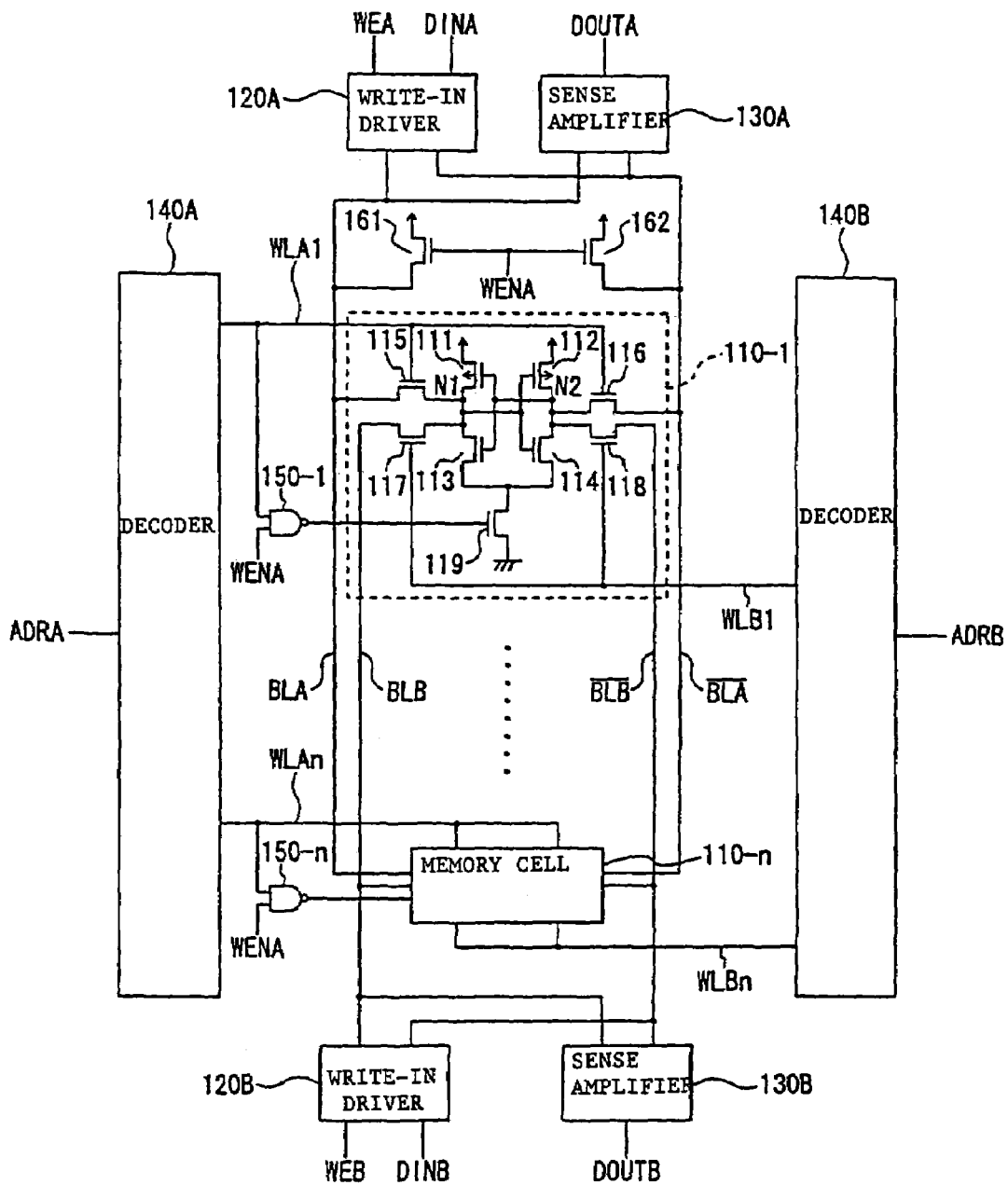
FIG. 1 is a circuit diagram schematically showing a structure of a multi-port semiconductor memory according to the first embodiment.

Hereinafter, embodiments of the invention are described using the drawings. In the drawings, size, shape, and arrangement of respective components are merely shown schematically in such a degree that the invention can be simply understood, and numerical conditions described below are only for exemplification.

First Embodiment

FIG. 1 is a circuit diagram schematically showing a structure of a multi-port semiconductor memory according to the first embodiment of the invention.

As shown in FIG. 1, the multi-port semiconductor memory 100 of the embodiment has memory cells 110-1 to 110-n; a port A write-in driver 120A; a port B write-in driver 120B; a port A sense amplifier 130A; a port B sense amplifier 130B; a port A decoder 140A; a port B decoder 140B; NAND gates 150-1 to 150-n; pull-up transistors 161, 162; a pair of bit lines for port A BLA, /BLA; a pair of bit lines for port B BLB, /BLB; word lines for port A WLA1 to WLAn; and word lines for port B WLB1 to WLBn.

The memory cell 110-1 has PMOS transistors 111, 112 and NMOS transistors 113 to 119.

The MOS transistors 111 to 114 form a flip-flop for storing data. The PMOS transistor 111 has a source connected to a power line VDD, drain connected to a node N1, and gate connected to a node N2. The PMOS transistor 112 has a source connected to the power line VDD, drain connected to the node N2, and gate connected to the node N1. The NMOS transistor 113 has a source connected to a drain of the NMOS transistor 119, drain connected to the node N1, and gate connected to the node N2. The NMOS transistor 114 has a source connected to the drain of the NMOS transistor 119, drain connected to the node N2, and gate connected to the node N1.

The NMOS transistors 115 to 118 are gates between the flip-flop and the bit lines BLA, /BLA, BLB, and /BLB. The NMOS transistor 115 has a source connected to the port A bit line BLA, drain connected to the node N1, and gate connected to the port A word line WLA1. The NMOS transistor 116 has a source connected to the inversion bit line for port A /BLA, drain connected to the node N2, and gate connected to the port A word line WLA1. The NMOS transistor 117 has a source connected to the port B bit line BLB, drain connected to the node N1, and gate connected to the port B word line WLB1. The NMOS transistor 118 has a source connected to the inversion bit line for port B /BLB, drain connected to the node N2, and gate connected to the port B word line WLB1.

The NMOS transistor 119 is used for connection or shut-off between the NMOS transistors 117, 118 and a ground line GND. The NMOS transistor 119 has a source connected to the ground line GND, drain connected to the sources of the NMOS transistors 117, 118, and gate connected to an output end of the NAND gate 150-1. The NMOS transistor 119 is equivalent to a first regulator circuit of the invention.

Description of structures of the memory cells 110-2 to 110-n is omitted because the structures are same as that of the memory cell 110-1.

For the port A write-in driver 120A, a write-in enable signal for port A WEA and an input data for port A DINA are inputted externally. The port A write-in driver 120A outputs the input data DINA to the bit line BLA and outputs an inversion value of the input data DINA to the inversion bit line /BLA, when the write-in enable signal WEA is high-level. Also, for the port B write-in driver 120B, a write-in enable signal for port B WEB and an input data for port B DINB are inputted externally. The port B write-in driver 120B outputs the input data DINB to the bit line BLB and outputs an inversion value of the input data DINB to the inversion bit line /BLB, when the write-in enable signal WEB is high-level.

For the port A sense amplifier 130A, electrical potential of the bit line pair BLA, /BLA is inputted, thereby a storage value is evaluated. The storage value obtained from the evaluation is output externally as an output data for port A DOUTA.

Also, for the port B sense amplifier 130B, electrical potential of the bit line pair BLB, /BLB is inputted, thereby a storage value is evaluated. The storage value obtained from the evaluation is output externally as an output data for port B DOUTB.

For the port A decoder 140A, a port A address ADRA is inputted externally. In addition, the port A decoder 140A, among the word lines for port A WLA1 to WlAn, makes a word line corresponding to the inputted address ADRA to be on high-level, and makes the other word lines to be on low-level. Also, for the port B decoder 140B, a port B address ADRB is inputted externally. The port B decoder 140B, among the word lines for port B WLB1 to WLBn, makes a word line corresponding to the inputted address ADRB to be on high-level, and makes the other word lines to be on low-level.

The NAND gates 150-1 to 150-n have one input terminals connected to the corresponding word lines WLA1 to WLAn, and the other input terminals through which the write-in enable signals WENA are inputted. As described above, the output terminals of the NAND gates 150-1 to 150-n are connected to the gates of the NMOS transistors 119.

The NMOS transistor 161 has a source connected to the bit line BLA, drain connected to the power line VDD, and gate through which. the write-in enable signal WENA is inputted. Also, the NMOS transistor 162 has a source connected to the inversion bit line /BLA, drain connected to the power line VDD, and gate through which the write-in enable signal WENA is inputted. The NMOS transistors 161, 162 are equivalent to the first pull-up circuit of the invention.

The write-in enable signals WEA and WENA can be a same signal.

Next, operation of the multi-port semiconductor memory 100 shown in FIG. 1 is described taking the case where write-in in the memory cell 110-1 through the port A and read-out from the memory cell 110-n through the port B are carried out simultaneously as an example.

Figure 2:
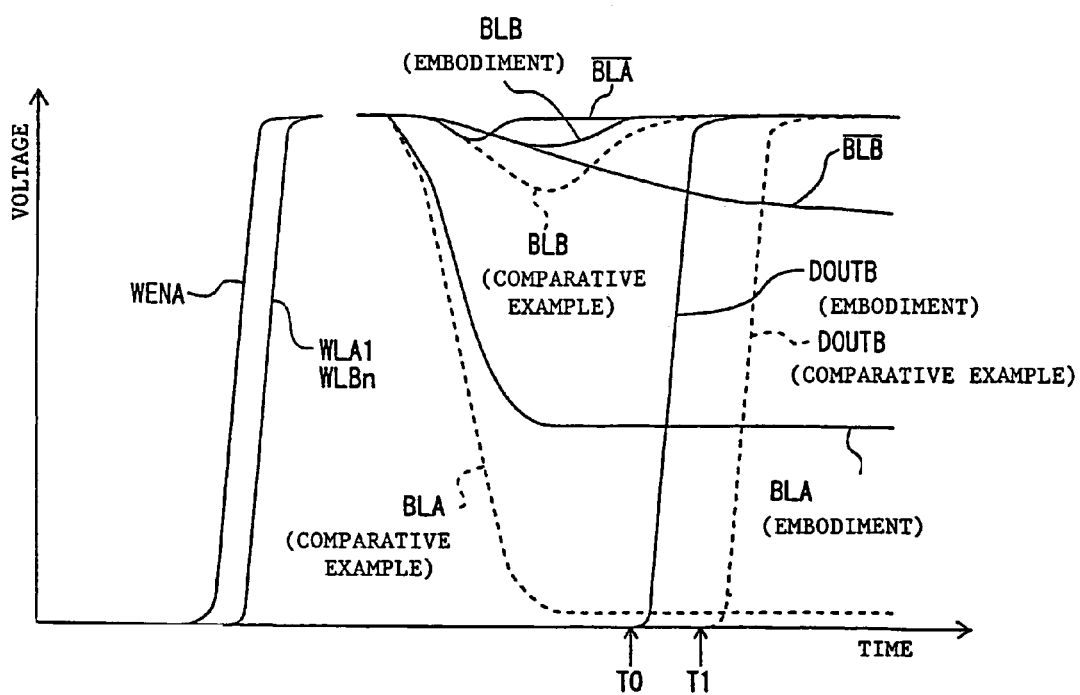
FIG. 2 is a view for illustrating operation of the multi-port semiconductor memory according to the first embodiment.

FIG. 2 is a view for illustrating the operation of the multi-port semiconductor memory 100 according to the embodiment. In FIG. 2, the ordinate shows voltage and the abscissa shows time.

First, the address ADRA is inputted for the port A decoder 140A and ADRB is inputted for the port B decoder 140B simultaneously. As described above, in the description, the address ADRA is an address for the memory cell 110-1, and the address ADRB is an address for the memory cell 110-n. The decoder 140A, in response to the input of the address ADRA, sets the port A word line WLA1 to be on high-level. Thus, the NMOS transistors 115, 116 in the memory cell 110-1 become on. The decoder 140B, in response to the input of the address ADRB, sets the port B word line WLBn to be on high-level. Thus, the NMOS transistors 117, 118 (not shown) in the memory cell 110-n become on.

Next, an external circuit sets the write-in enable signals WEA, WENA to be on high-level.

As described above, the port A word line WLA1 is on high-level. Therefore, when the write-in enable WENA is high-level, the output of the NAND gate 150-1 becomes low-level. Therefore, the NMOS transistor 119 in the memory cell 110-1 becomes off. Accordingly, the sources of the NMOS transistors 113, 114 in the memory cell 110-1 are shut-off from the ground line GND.

When the write-in enable signal WEA is high-level, the port A write-in driver 120A outputs the input data DINA to the bit line BLA and outputs the inversion value of the input data DINA to the inversion bit line /BLA. In the example of FIG. 2, low-level is output for the bit line BLA, and high-level is output for the inversion bit line /BLA. Here, the write-in enable signal WENA is set to be high-level, thereby the NMOS transistors 161, 162 become on, therefore electrical potential of the power line VDD is applied to the bit lines for port A BLA, /BLA. In this case, the low-level, which is determined by a ratio of current emission ability of the MOS transistor (not shown) provided on the write-in driver 120A to current supply ability of the NMOS transistors 161, 162, is, for example, 0.9 V. On the other hand, the high-level of the bit line pair BLA, /BLA is not pulled up because it is approximately equivalent to the VDD (for example, 3 V) originally. In this way, the electrical potential of the bit line BLA is, for example, 0.9 V, and the electrical potential of the inversion bit line /BLA is, for example, 3 V.

In the memory cell 110-1, low-level is inputted for the node N1, and high-level is inputted for the node N2. Since the node N1 is on low-level, the PMOS transistor 112 becomes on and the NMOS transistor 114 becomes off. Accordingly, the node N2 is kept to be on high-level. Since the node N2 is on high-level, the PMOS transistor 111 becomes off and the NMOS transistor 113 becomes on. Accordingly, the node N1 is kept to be on low-level. In this way, data are written in the memory cell 110-1. For the other memory cells 110-2 to 110-n, since the NMOS-transistors 115, 116 (not shown) are being off, data are not written-in. In the embodiment, since the NMOS transistor 119 is being off, source potential of the NMOS transistors 113, 114 is increased. Therefore, since voltage between the gate and source is decreased, on-resistance of the NMOS transistors 113, 114 is increased. Accordingly, while the electrical potential of the bit line BLA is pulled up, the NMOS transistors 113, 114 can operate normally.

As described above, when the port B word line WLBn is on high-level, the NMOS transistors 117, 118 in the memory cell 110-n become on. Thus, the electrical potential of the nodes N1, N2 in the memory cell 110-n is output to the bit line pair for port B BLB, /BLB. In the example of FIG. 2, high-level is output for the bit line BLB and low-level is output for the inversion bit line /BLA. Here, the pair of bit lines for port B BLB, /BLB are not pulled up. Since the port A word line WLAn is on low-level, the NMOS transistor 119 in the memory cell 110-n is on. Accordingly, in the bit line pair for port B BLB, /BLB, the high-level is, for example, 3 V, and the low-level is, for example, 0 V. The port B sense amplifier 130B reads electrical potential of the bit line pair for port B BLB, /BLB, after the electrical potential of the bit line pair for port B BLB, /BLB is stabilized. The port B sense amplifier 130B outputs the electrical potential corresponding to the read electrical potential as the read-out data DOUTB.

As described above, in the operation example, the port A bit line BLA is on low-level, and the port B bit line BLB is on high-level (see FIG. 2). If the electrical potential of the port A bit line BLA is reduced to low-level while the port B bit line BLB is being on high-level, coupling noise is generated due to coupling capacitance between the bit lines BLA and BLB. However, in the multi-port semiconductor memory 100 of the embodiment, the coupling noise slightly influences on read-out timing of the sense amplifier 130B for the following reason.

Figure 3:
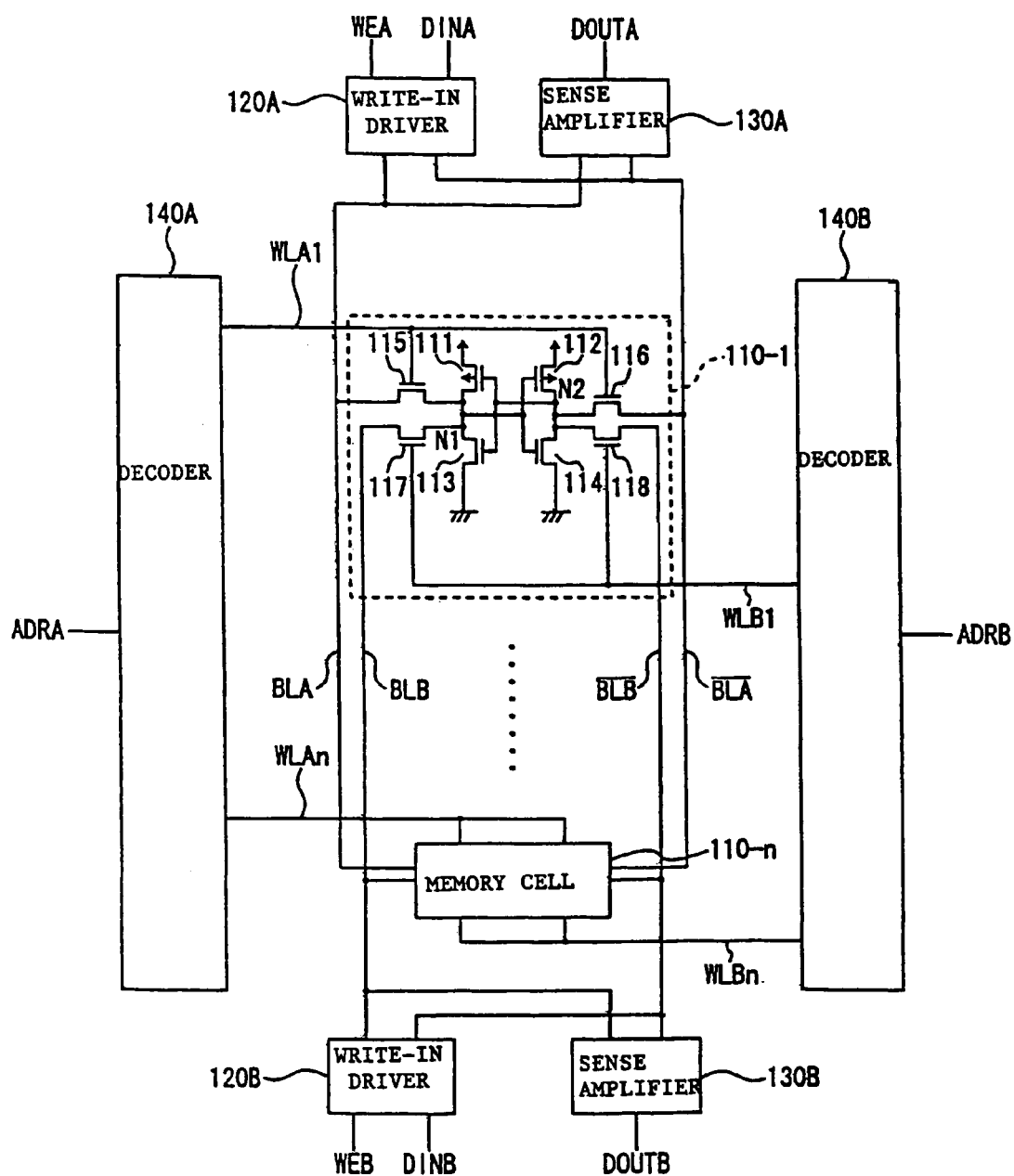
FIG. 3 is a circuit diagram schematically showing a structure of a multi-port semiconductor memory for comparison.

FIG. 3 is a circuit diagram showing a structure of a multi-port semiconductor memory 300 for comparison. In FIG. 3, each of components to which same symbols as those in FIG. 1 are marked shows the same component as that in FIG. 1. That is, the comparative example of FIG. 3 is different from the multi-port semiconductor memory 100 of the invention in that the pull-up NMOS transistors 161, 162 and the circuits for floating the flip-flop 119 and 150-1 to 150-n are not provided.

In the multi-port semiconductor memory 300 for comparison, the pair of bit lines for port A BLA, /BLA are not pulled up. Therefore, low-level for the bit line pair for port A BLA, /BLA is equal to that of the bit line pair for port B BLB, /BLB, and the low-level is, for example, 0 V. Accordingly, when the port A bit line BLA is on low-level and the port B bit line BLB is on high-level, potential difference between the bit lines BLA and BLB is, for example, 3 V. Therefore, if the electrical potential of the port A bit line BLA is reduced to low-level while the port B bit line BLB is being on high-level, large coupling noise is generated in the bit line BLB. If the coupling noise is generated, potential difference between high-level and low-level becomes smaller than a design value. Accordingly, if the port B sense amplifier 130B reads the electrical potential of the bit line pair BLB, /BLB while the coupling noise is being generated, wrong read-out is apt to occur. Therefore, read-out timing of the port B sense amplifier 130B needs to be delayed until the coupling noise is disappeared. In FIG. 2, the read-out timing of the comparative example (or multi-port semiconductor memory 300) is shown by a mark T1.

On the other hand, in the multi-port semiconductor memory 100 of the embodiment, the pair of bit lines for port A BLA, /BLA are pulled up. Therefore, low-level for the bit line pair for port A BLA, /BLA is, for example, 0.9 V. Accordingly, when the port A bit line BLA is on low-level and the port B bit line BLB is on high-level, the potential difference between the bit lines BLA and BLB is, for example, 2.1 V, which is smaller than that in the comparative example 300. Therefore, when the electrical potential of the port A bit line BLA is reduced to low-level while the port B bit line BLB is being on high-level, the coupling noise is smaller than that in the comparative example 300. Accordingly, generating time of the coupling noise is also smaller than that in the comparative example 300. Therefore, read-out timing of the port B sense amplifier 130B can be advanced compared with the comparative example 300. In FIG. 2, the read-out timing of the multi-port semiconductor memory 100 according to the embodiment is shown by a mark T0. In the multi-port semiconductor memory 100 of the embodiment, while the pair of bit lines for port A BLA, /BLA are pulled up, the pair of bit lines for port B BLB, /BLB are not pulled up. Therefore, in the bit line pair for port B BLB, /BLB, low level is, for example, 0 V as the comparative example 300. Accordingly, since the potential difference between the bit line pair BLB and /BLB is sufficiently large, reading accuracy of the sense amplifier 130B is not deteriorated.

As described hereinbefore, according to the embodiment, when write-in through the port A and read-out through the port B are carried out simultaneously, the multi-port semiconductor memory 100 can be operated fast without reducing reliability of the read-out data.

Second Embodiment

Figure 4:
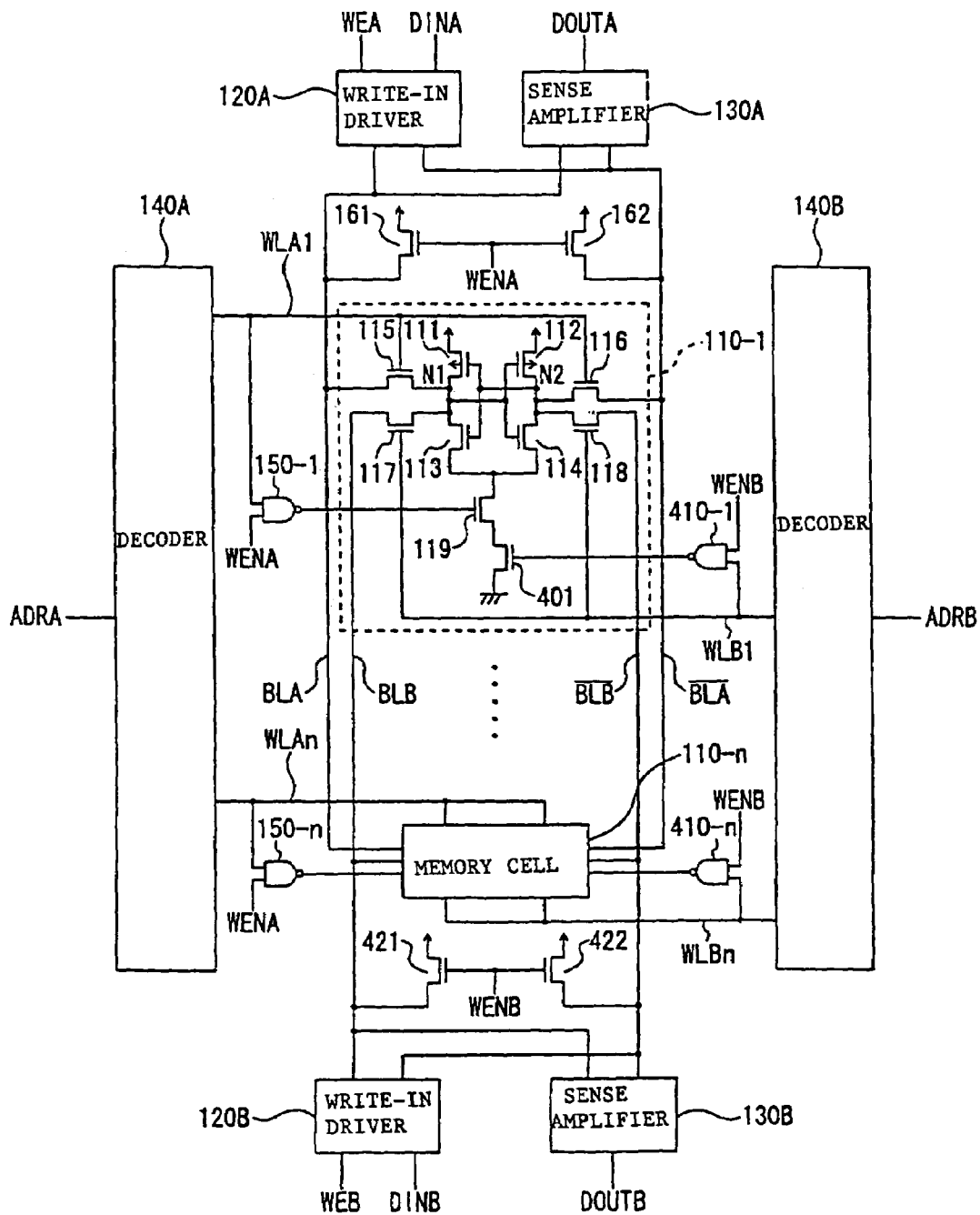
FIG. 4 is a circuit diagram schematically showing a structure of a multi-port semiconductor memory according to the second embodiment.

Next, the second embodiment of the invention is described using FIG. 4. In FIG. 4, components to which same symbols as those in FIG. 1 are marked show same components as in FIG. 1.

As shown in FIG. 4, in a multi-port semiconductor memory 400 of the embodiment, NMOS transistors 401 are provided in the memory cells 110-1 to 110-n. The NMOS transistors 401 have sources connected to the ground line GND, and drains connected to the sources of the NMOS transistors 119. The NMOS transistors 401 are equivalent to a second regulator circuit of the invention.

The multi-port semiconductor memory 400 has NAND gates 410-1 to 410-n. The NAND gates 410-1 to 410-n have one input terminals connected to the corresponding port B word lines WLB1 to WLBn, and the other input terminals through which write-in enable signals WENB are inputted. Output terminals of the NAND gates 410-1 to 410-n are connected to gates of the NMOS transistors 401.

In addition, the multi-port semiconductor memory 400 has NMOS transistors 421, 422 for pulling up the bit line pair for port B BLB, /BLB. The NMOS transistor 421 has a source connected to the bit line BLB, drain connected to the power line VDD, and gate through which the write-in enable signal WENB is inputted. Also, the pull-up NMOS transistor 422 has a source connected to the inversion bit line /BLB, drain connected to the power line VDD, and gate through which the write-in enable signal WENB is inputted. The NMOS transistors 421, 422 are equivalent to a second pull-up circuit of the invention.

The write-in enable signals WEB and WENB can be a same signal.

Next, operation of the multi-port semiconductor memory 400 shown in FIG. 4 is described taking the case where write-in in the memory cell 110-1 through the port B and read-out from the memory cell 110-n through the port A are carried out simultaneously as an example.

First, the address ADRA is inputted for the port A decoder 140A and ADRB is inputted for the port B decoder 140B simultaneously. As described above, in the description, the address ADRA is an address for the memory cell 110-n, and the address ADRB is an address for the memory cell 110-1. The decoder 140A, in response to the input of the address ADRA, sets the port A word line WLAn to be on high-level. Thus, the NMOS transistors 115, 116 (not shown) in the memory cell 110-n become on. The decoder 140B, in response to the input of the address ADRB, sets the port B word line WLB1 to be on high-level. Thus, the NMOS transistors 117, 118 in the memory cell 110-1 become on.

Next, an external circuit sets the write-in enable signals WEB, WENB to be high-level.

As described above, the port B word line WLB1 is on high-level. Therefore, when the write-in enable signal WENB is high-level, output from the NAND gate 410-1 is low-level. Therefore, the NMOS transistor 401 in the memory cell 110-1 becomes off. Accordingly, the sources of the NMOS transistors 113, 114 in the memory cell 110-1 are shut-off from the ground line GND.

When the write-in enable signal WEB is high-level, the port B write-in driver 120B outputs the input data DINB to the bit line BLB and outputs an inversion value of the input data DINB to the inversion bit line /BLB. Here, it is assumed that low-level is output for the bit line BLB, and high-level is output for the inversion bit line /BLB. As the first embodiment, the write-in enable signal WENB is set to be high-level, thereby the NMOS transistors 421, 422 become on. Thus, the pair of bit lines for port B BLB, /BLB are pulled up to, for example, 0.9 V.

In the memory cell 110-1, low-level is applied to the node N1, and high-level is applied to the node N2. As the first embodiment, data is written in the flip-flop in the memory cell 110-1. For the other memory cells 110-2 to 110-n, since the NMOS transistors 117, 118 are being off, data can not be written. In the embodiment, since the NMOS transistor 401 is being off, source potential of the NMOS transistors 113, 114 is increased. Therefore, on-resistance of the NMOS transistors 113, 114 becomes large because voltage between the gate and the source is reduced. Accordingly, while the electrical potential of the bit line BLB is pulled up, the NMOS transistors 113, 114 can operate normally.

As described above, the port A word line WLAn is also on high-level, accordingly, the NMOS transistors 115, 116 in the memory cell 110-n become on. Thus, electrical potential of the nodes N1, N2 in the memory cell 110-n is output to the bit line pair for port A BLA, /BLA. In the description, it is assumed that high-level is output for the bit line BLA, and low-level is output for the inversion bit line /BLA. In this case, coupling noise is generated between the bit lines BLA and BLB. However, as the first embodiment, since the low level is, for example, 0.9 V, generating time of the coupling noise is short compared with the comparative example 300 (see FIG. 3). The port A sense amplifier 130A reads electrical potential of the bit line pair for port A BLA, /BLA after the electrical potential of the bit line pair for port A BLA, /BLA is stabilized. The port A sense amplifier 130A outputs electrical potential corresponding to the read electrical potential as the read-out data DOUTA.

In this way, in the embodiment, the bit line pair for port B BLB, /BLB can be pulled up. Accordingly, even when write-in in the memory cell 110-1 through the port B and read-out from the memory cell 110-n through the port A are carried out simultaneously, the operation speed can be improved without reducing reliability of the read-out data.

Description on operation in the case that write-in through the port A and read-out through the port B are carried out simultaneously is omitted because the operation is same as that in the first embodiment.

In this way, according to the multi-port semiconductor memory 400 of the embodiment, without regard to selection of a port that performs write-in or read-out, improvement of reliability of read-out data and speed-up of operation can be achieved.

It will be appreciated for those skilled in the art that various modification and variation can be made from the invention without departing from the spirit and scope of the invention. For example, although number of input and output ports is made to be two in each of the above described embodiments, a multi-port semiconductor memory having not less than three of the input and output ports may be included in the invention. The invention given within the scope of the appended claims and their equivalent scope is intended to cover any modification and variation of the invention.

This application is based on a Japanese patent application No. 2003-322802 which is incorporated herein by reference.

What is claimed is:

1. A semiconductor memory comprising:
  a memory cell array including a plurality of memory cells,
  a first bit line pair connected to the plurality of memory cells and performing write-in or read-out of complementary data for the plurality of memory cells in the memory cell array,
  a second bit line pair performing write-in or read-out of complementary data for the plurality of memory cells in the memory cell array,
  a plurality of first word lines provided to the plurality of memory cells for selecting a first memory cell from the memory cell array,
  a plurality of second word lines provided to the plurality of memory cells for selecting a second memory cell from the memory cell array,
  a first pull-up circuit that, when data is written in the first memory cell from the first bit line pair, pulls up low level of a lower-level line of the first bit line pair, and a plurality of first regulator circuits each connected to a corresponding one of the plurality of memory cells, wherein the first regulator circuit places the first memory cell in a floating state when the first memory cell is selected, and connects the first memory cell to a predetermined voltage when the first memory cell is not selected.

2. A semiconductor memory according to claim 1, further comprising:

a second pull-up circuit that, when data is written in the first memory cell that is selected from the second bit line pair, pulls up low level of a lower-level line of the second bit line pair.

3. A semiconductor memory according to claim 1, wherein the first regulator circuit includes a MOS transistor, the MOS transistor being connected to the first memory cell and a line with which a predetermined voltage is provided, and wherein the MOS transistor is turned off when data is written in the first memory cell from the first bit line pair.

4. A semiconductor memory according to claim 1, wherein a source and a drain of the MOS transistor of the first regulator circuit are connected to a ground and a source of the MOS transistor of the first memory cell, respectively.

* * * * *